(12) United States Patent
Kawai et al.

(10) Patent No.: US 7,226,654 B2
(45) Date of Patent: Jun. 5, 2007

(54) LAMINATED WIRING BOARD AND ITS MOUNTING STRUCTURE

(75) Inventors: Shinya Kawai, Kokubu (JP); Masanari Kokubu, Kokubu (JP); Youji Furukubo, Kokubu (JP)

(73) Assignee: Kyocera Corporation, Kyoto (JP)

( * ) Notice: Subject to any disclaimer, the term of this patent is extended or adjusted under 35 U.S.C. 154(b) by 210 days.

(21) Appl. No.: 10/902,677

(22) Filed: Jul. 28, 2004

(65) Prior Publication Data
US 2005/0023032 A1   Feb. 3, 2005

(30) Foreign Application Priority Data

| Jul. 29, 2003 | (JP) | ............................. 2003-203413 |
| Jul. 29, 2003 | (JP) | ............................. 2003-203414 |
| Jul. 29, 2003 | (JP) | ............................. 2003-203416 |
| Jul. 29, 2003 | (JP) | ............................. 2003-203418 |
| Aug. 26, 2003 | (JP) | ............................. 2003-301191 |

(51) Int. Cl.
| B32B 3/00 | (2006.01) |
| H06K 1/00 | (2006.01) |
| H01R 9/09 | (2006.01) |
| H01L 23/06 | (2006.01) |

(52) U.S. Cl. ...................... 428/210; 174/255; 174/258; 174/260; 174/261; 174/264; 257/684; 257/703; 361/760; 361/762

(58) Field of Classification Search ................ 174/250, 174/258, 260–262, 255, 264; 257/684–688, 257/700–703; 428/210; 361/762
See application file for complete search history.

(56) References Cited

U.S. PATENT DOCUMENTS 4,943,468 A * 7/1990 Gordon et al. .............. 428/210

5,483,421 A * 1/1996 Gedney et al. .............. 361/771
5,574,630 A * 11/1996 Kresge et al. ............... 361/792
5,834,848 A * 11/1998 Iwasaki ....................... 257/778
5,952,709 A * 9/1999 Kitazawa et al. ........... 257/664

(Continued)

FOREIGN PATENT DOCUMENTS

JP         10-247706         9/1998

*Primary Examiner*—Cathy F. Lam
(74) *Attorney, Agent, or Firm*—Hogan & Hartson LLP

(57) ABSTRACT

A laminated wiring board comprising:
  a first wiring board forming wiring layers on the upper surface and on the lower surface of a first ceramic insulated substrate; and
  a second wiring board forming wiring layers on the upper surface and on the lower surface of a second ceramic insulated substrate;
  the wiring layer on the lower surface of the first wiring board and the wiring layer on the upper surface of the second wiring board being connected together through connecting electrodes;
  wherein a coefficient $\alpha_1$ of thermal expansion of the first ceramic insulated substrate at 0 to 150° C. and a coefficient $\alpha_2$ of thermal expansion of the second ceramic insulated substrate at 0 to 150° C. are satisfying the following conditions:

$\alpha_1 < \alpha_2$ $\alpha_2 - \alpha_1 \leq 9 \times 10^{-6}/°$ C.

The laminated wiring board offers a high degree of mounting reliability even when it is interposed between the electric device such as a silicon semiconductor device having a small coefficient of thermal expansion and an external circuit board such as a printed board having a large coefficient of thermal expansion.

17 Claims, 2 Drawing Sheets

U.S. PATENT DOCUMENTS

| | | | | |
|---|---|---|---|---|
| 6,002,177 A * | 12/1999 | Gaynes et al. | ............. | 257/774 |
| 6,201,307 B1 * | 3/2001 | Terashi et al. | ............. | 257/784 |
| 6,232,251 B1 * | 5/2001 | Terashi et al. | ................ | 501/5 |
| 6,317,331 B1 * | 11/2001 | Kamath et al. | ............. | 361/760 |
| 6,351,393 B1 * | 2/2002 | Kresge et al. | ............. | 361/795 |
| 6,373,717 B1 * | 4/2002 | Downes et al. | ............. | 361/795 |
| 6,486,415 B2 * | 11/2002 | Jimarez et al. | ............. | 174/263 |
| 6,528,145 B1 * | 3/2003 | Berger et al. | ............... | 428/156 |
| 6,734,540 B2 * | 5/2004 | Fritz | ......................... | 257/686 |
| 6,953,756 B2 * | 10/2005 | Kawai et al. | .................. | 501/9 |

\* cited by examiner

LAMINATED WIRING BOARD AND ITS MOUNTING STRUCTURE

BACKGROUND OF THE INVENTION

1. Field of the Invention

The present invention relates to a laminated wiring board and to its mounting structure. In particular, the invention relates to a laminated wiring board constituted by two kinds of wiring boards having different coefficients of thermal expansion, featuring high mounting reliability and is adapted to transmitting signals at high speeds, and to a mounting structure thereof.

2. Description of the Related Art

An electric device as represented by a semiconductor device using silicon as a chief component includes a number of transistors having very microscopic wiring circuit layers, which are integrated to a high degree, and its size is ever increasing due to an ever increase in the number of transistors. In the electric device, further, attempts have been made to realize fine wiring circuit layers, to decrease the resistance and to decrease the dielectric constant in the interlayer insulating film in order to cope with an increase in the speed of signal processing resulting, therefore, in a decrease in the mechanical strength in the wiring circuit layers and in the interlayer insulating film constituting the electric device.

Accompanying the development in the technology for integrating electric devices in recent years, further, there has been developed a method capable of forming, in the electric device itself, a solid structure and a functional unit having a moving part. For example, there have been put into practical use a fine solid structure called MEMS (micro electro mechanical system) and an electric device having a moving part. In the electric device produced by the above method, however, the solid structure and the moving part are subject to be destroyed due to stress.

When the electric device having such microscopic wiring circuit layers is incorporated in electronic equipment such as a personal computer, a cell phone or a liquid crystal display device, a hierarchical mounting is employed, such as mounting the electric device on a wiring board like a package for containing the electric device (primary mounting) to adjust the size relative to the microscopic wirings and, then, mounting the wiring board on which the electric device is mounted on an external circuit board such as a printed board (secondary mounting).

Japanese Unexamined Patent Publication (Kokai) No. 10-247706 proposes a mounting structure in which, as illustrated in FIG. 4, a wiring board interposed between an electric device 101 and an external circuit board 103 has a two-step structure. Namely, in this mounting structure, a ceramic wiring board 105 is arranged on the side of the electric device 101, and a resin wiring board 107 is arranged on the side of the external circuit board 103.

However, if the above mounting structure is subjected to the cooling/heating cycles in the mounting step such as temperature cycle testing and reflow heating, the connection electrodes 109 provided between the ceramic wiring board 105 and the resin board 107 are subject to be destroyed deteriorating the reliability of mounting. Further, when there is used the electric device 101 having a decreased mechanical strength due to an increase in the size or an increase in the function, application of the above thermal hysteresis causes the electric device 101 itself to be broken.

Namely, the above problems stem from the thermal stress taking place between the ceramic wiring board 105 and the resin board 107 and from the thermal stress taking place between the electric device 101 and the ceramic wiring board 105.

SUMMARY OF THE INVENTION

It is therefore an object of the present invention to provide a wiring board which offers a high degree of mounting reliability even when it is interposed between the electric device comprising silicon as a chief component and having a small coefficient of thermal expansion and an external circuit board such as a printed board having a large coefficient of thermal expansion, and a mounting structure thereof.

According to the present invention, there is provided a laminated wiring board comprising:

a first wiring board forming wiring layers on an upper surface and on a lower surface of a first ceramic insulated substrate; and a second wiring board forming wiring layers on an upper surface and on a lower surface of a second ceramic insulated substrate;

the wiring layer on the lower surface of the first wiring board and the wiring layer on the upper surface of the second wiring board being connected together through connecting electrodes;

wherein a coefficient $\alpha_1$ of thermal expansion of the first ceramic insulated substrate at 0 to 150° C. and a coefficient $\alpha_2$ of thermal expansion of the second ceramic insulated substrate at 0 to 150° C. are satisfying the following conditions:

$$\alpha_1 < \alpha_2$$

$$\alpha_2 - \alpha_1 \leq 9 \times 10^{-6}/°\text{C}.$$

The above laminated wiring board is used as a package for enclosing the electric device by connecting the electric device to the upper surface of, for example, the first wiring board through a plurality of connecting portions. In this case, it is desired that a difference between the coefficient $\alpha_1$ of thermal expansion of the first insulating board and the coefficient $\alpha_3$ of thermal expansion of the electric device at 0 to 150° C. is in a range which is not larger than $5 \times 10^{-6}/°$ C.

According to the present invention, further, there is provided a mounting structure in which an external circuit board is connected, via a plurality of connecting electrodes, to the lower surface of a second wiring board in the laminated wiring board to which an electric device is connected, wherein a difference between a coefficient $\alpha_4$ of thermal expansion of the external circuit board at 0 to 150° C. and a coefficient $\alpha_2$ of thermal expansion of a second insulated substrate is not larger than $12 \times 10^{-6}/°$ C.

In the present invention, the coefficients of thermal expansion are all those within a range of 0 to 150° C. In the following description, however, this temperature range is not stated.

In the laminated wiring board of the present invention, the coefficient $\alpha_1$ of thermal expansion of the first wiring board (coefficient of thermal expansion of the first insulated substrate) of the side on where the electric device is mounted (primary mounting) is smaller than the coefficient $\alpha_2$ of thermal expansion of the second wiring board (coefficient of thermal expansion of the second insulated substrate) of the side on where the external circuit board is mounted (secondary mounting). Besides, the difference between $\alpha_1$ and $\alpha_2$ is set to be not larger than $9 \times 10^{-6}/°$ C. Therefore, the two wiring boards are connected together highly reliably featuring highly reliable primary mounting and secondary mounting. For example, even when an electric device having a decreased mechanical strength due to an increase in the size or due to an increase in the function is mounted, a drop in the reliability of connection between the electric device and the first wiring board due to severe thermal hysteresis is effectively prevented and, besides, the electric device itself is effectively prevented from being broken down. Therefore, the laminated wiring board of the present invention is suited for processing signals at high speeds. Further, even in the mounting structure mounting an external circuit board having a considerably small coefficient of thermal expansion, such as a printed board, a drop in the reliability of connection between the second wiring board and the external circuit board due to the thermal hysteresis is effectively prevented.

DETAILED DESCRIPTION OF THE INVENTION

The invention will now be concretely described with reference to the accompanying drawings.

[Laminated Wiring Board]

Figure 1:
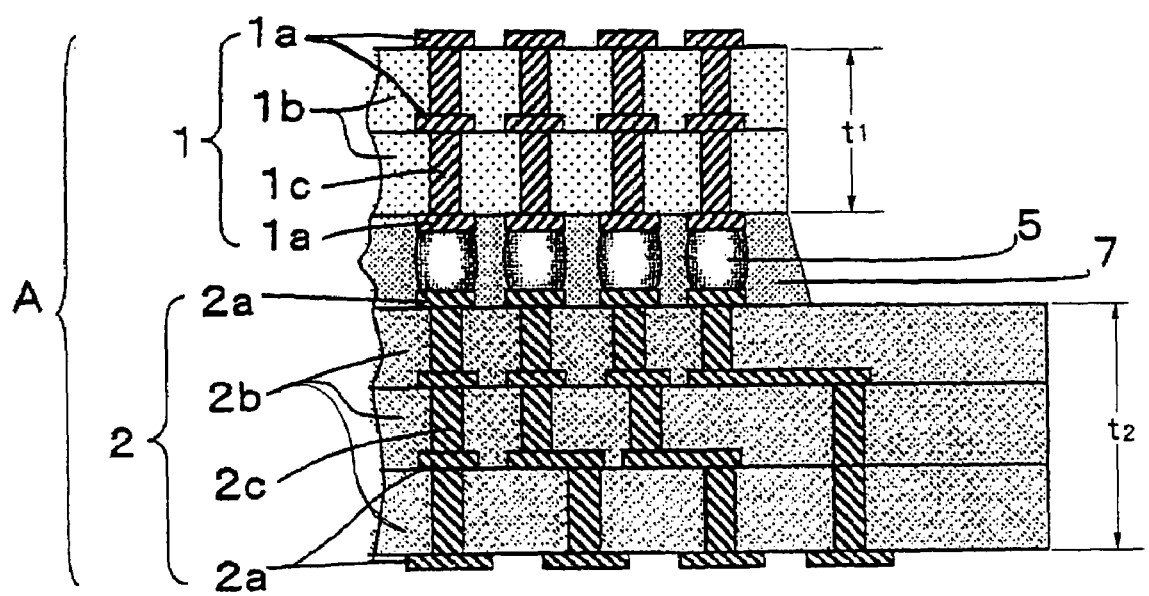
FIG. 1 is a sectional view schematically illustrating a laminated wiring board of the present invention.

Referring to FIG. 1 illustrating the structure of a laminated wiring board of the invention, the laminated wiring board generally designated at A is constituted by a first wiring board 1 of the upper side and a second wiring board 2 of the lower side which are connected together through a plurality of connecting electrodes 5.

The first wiring board 1 is constituted by forming wiring layers 1a on the upper surface and on the lower surface of a first ceramic insulated substrate 1b. In FIG. 1, further, the first insulated substrate 1b is of a two-layer structure, and the wiring layer 1a is formed even between these layers. The wiring layers 1a formed on the upper surface, on the back surface and in the inside are electrically connected together through via-hole conductors 1c. The first insulated substrate 1b may be of a single layer or of a multiplicity of layers greater than two layers.

The second wiring board 2 is constituted by forming wiring layers 2a on the upper surface and on the lower surface of the second ceramic insulated substrate 2b. In FIG. 1, the second insulated substrate 2b is of a three-layer structure, and the wiring layer 2a is formed even between these layers. The wiring layers 2a formed on the upper surface, on the back surface and in the inside are electrically connected together through via-hole conductors 2c. The second insulated substrate 2b, too, may be of a single layer, two layer or a multiplicity of layers greater than three layers.

In the laminated wiring board of the present invention as will be understood from FIG. 1, the wiring layer 1a on the back surface of the first wiring board 1 is connected to the wiring layer 2a on the upper surface of the second wiring board 2 through the connecting electrodes 5. It is desired that the connecting electrodes 5 are buried in a sealing agent 7 containing an organic resin.

In the laminated wiring board A of the present invention, it is important that a coefficient $\alpha_1$ of thermal expansion of the first insulated substrate 1b of the first wiring board 1 and a coefficient $\alpha_2$ of thermal expansion of the second insulated substrate 2b of the second wiring board 2 are satisfying the following conditions:

$$\alpha_1 < \alpha_2$$

$$\alpha_2 - \alpha_1 \leq 9 \times 10^{-6}/°C.$$

In particular, it is desired that a difference ($\alpha_2 - \alpha_1$) between $\alpha_2$ and $\alpha_1$ is not larger than $8.5 \times 10^{-6}/°C$. and, most desirably, not larger than $8 \times 10^{-6}/°C$. That is, in the laminated wiring board A of the present invention, an electric device that will be described later is mounted on the first wiring board 1 of the upper layer (primary mounting), and the second wiring board 2 of the lower layer is mounted on an external circuit board (secondary mounting). Here, as the coefficient $\alpha_1$ of thermal expansion of the first insulated substrate 1b and the coefficient $\alpha_2$ of thermal expansion of the second insulated substrate 2b satisfy the above-mentioned relationship, thermal stress stemming from the difference in the coefficient of thermal expansion between the electric device and the external circuit board is dispersed into both the first wiring board 1 and the second wiring board 2 to relax the concentration of stress in the laminated wiring board A and in the connecting electrodes 5. As a result, reliability is maintained in the mounting between the electric device and the laminated wiring board A (primary mounting) and in the mounting between the laminated wiring board and the external circuit board (secondary mounting). Besides, thermal stress is decreased between the first wiring board 1 and the second wiring board 2, and reliability of connection is enhanced between the wiring boards 1 and 2.

When, for example, the coefficient $\alpha_1$ of thermal expansion of the first insulated substrate 1b is equal to, or greater than, the coefficient $\alpha_2$ of thermal expansion of the second insulated substrate 2b, thermal stress between the electric device and the external circuit board is not relaxed but is rather amplified, whereby the connecting electrodes 5 of the laminated wiring board A are cracked progressively and are finally broken down. In other words, the connecting electrodes 5 are broken down within decreased periods of time and long-time reliability of the connecting electrodes of the laminated wiring board A is lost to a conspicuous degree. Further, stress concentrates on the primary mounting side where the electric device and the first wiring board 1 are connected together and on the secondary mounting side where the secondary wiring board 2 and the external circuit board are connected. As a result, long-time reliability of connection is lost in the primary mounting and in the secondary mounting.

Further, when the difference ($\alpha_2 - \alpha_1$) in the coefficient of thermal expansion is greater than $9 \times 10^{-6}/°C.$, thermal stress becomes too great between the first wiring board 1 and the second wiring board 2. As a result, the connecting electrodes 5 lose reliability of connection and can no longer be put into practical use.

Wiring Layers 1a, 2a:

In the present invention, it is desired that the wiring layer 1a in the first wiring board 1 and the wiring layer 2a in the second wiring board contain any one of copper, silver or gold as a chief component. By using the above low-resistance conductor, the signals can be transmitted at high speeds with low loss. Similarly, it is desired that the via-hole conductors $1c$ and $2c$, too, contain the above low-resistance conductor.

First Insulated Substrate $1b$:

In the present invention, it is necessary that the coefficient $\alpha_1$ of thermal expansion of the first insulated substrate $1b$ in the first wiring board 1 satisfies the above-mentioned conditions, and is not larger than $7\times10^{-6}/°$ C., preferably, not larger than $6\times10^{-6}/°$ C. and, most preferably, not larger than $4.5\times10^{-6}/°$ C. from the standpoint of maintaining a highly reliable primary mounting even for the electric device comprising chiefly silicon having a low coefficient of thermal expansion. Namely, the coefficient $\alpha_1$ of thermal expansion lying in such a low range can be approximated to the coefficient of thermal expansion of the electric device comprising chiefly silicon. Therefore, even when there is mounted an electric device having a decreased mechanical resistance due to an increase in the size and due to an increase in the function, thermal stress can be decreased. As a result, the electric device is prevented from being broken down and a highly reliable primary mounting is realized.

It is further desired that the first insulated substrate $1b$ has a dielectric constant capacitance of not larger than 7, preferably, not larger than 6.5 and, most preferably, not larger than 6 from the standpoint of transmitting high-speed signals with less loss.

It is further desired that the first insulated substrate $1b$ has a thickness $t_1$ of not smaller than 0.2 mm, preferably, not smaller than 0.3 mm and, most preferably, not smaller than 0.4 mm. That is, when the laminated wiring board A is mounted on the external circuit board that will be described later, the second wiring board 2 comprising the second insulated substrate $2b$ is often warped due to a difference in the coefficient of thermal expansion between the first insulated substrate $1b$ and the external circuit board or the second insulated substrate $2b$. With the thickness of the first insulated substrate $1b$ being set to lie within the above range, however, the warping of the second wiring board 2 can be effectively suppressed by the first wiring board 1 comprising the first insulated substrate $1b$, and the long-time connection reliability of the connecting electrodes 5 can be further enhanced between the two wiring boards 1 and 2. Moreover, the warping of the first wiring board 1 itself caused by a difference in the coefficient of thermal expansion can be effectively suppressed. When the electric device is mounted on the first wiring board 1, therefore, stress generating under the electric device is relaxed, and the electric device itself is prevented from being destroyed.

In the present invention, it is desired that the first insulted substrate $1b$ having properties such as the above coefficient of thermal expansion and dielectric constant is made of low-firing ceramics that can be fired at not higher than 1000° C. and is, particularly, made of a glass ceramic sintered body obtained by firing a glass alone or the glass and a ceramic filler in combination from the standpoint of easily controlling the properties. In particular, a sintered body obtained by firing the glass and the ceramic filler (e.g., cordierite, alumina, gahnite, mullite, forsterite, zirconia, etc.) is best suited as a material for forming the first insulated substrate $1b$ since it makes it easy to adjust the properties such as the coefficient of thermal expansion and the dielectric constant upon adjusting the amount of blending the ceramic filler.

For example, in order to set the coefficient $\alpha_1$ of thermal expansion to be not larger than $4.5\times10^{-6}/°$ C. so as to be approximated to the coefficient of thermal expansion of the electric device comprising chiefly silicon, it is desired that the glass ceramic sintered body contains Si, Al, Mg, Zn, B and O as constituent elements, and further contains Pb and an alkali metal in amounts of not larger than 0.1 mass %, respectively, calculated as oxides thereof, and contains a cordierite crystal phase in an amount of, particularly, 0.5 to 20 mass %. The cordierite crystal phase is very effective in lowering the coefficient $\alpha_1$ of thermal expansion. It is desired that the cordierite crystal-containing sintered body has a composition containing, calculated as oxides, 20 to 53 mass % of $SiO_2$, 20 to 61 mass % of $Al_2O_3$, 2 to 24 mass % of MgO, 2 to 14 mass % of ZnO, and 2 to 14 mass % of $B_2O_3$ and contains, as a crystal phase, at least one component selected from the group consisting of alumina, gahnite, mullite, forsterite and zirconia other than cordierite in an amount of not larger than 35 mass %, so that the coefficient $\alpha_1$ of thermal expansion and the dielectric constant are adjusted to lie within suitable ranges. Further, the sintered body may contain a component stemming from a sintering assistant or a glass, i.e., may contain at least one component selected from the group consisting of CaO, SrO, BaO and $ZrO_2$ in an amount of not larger than 15 mass %. The assistant makes it possible to obtain a densely sintered body containing little voids.

The first insulated substrate $1b$ comprising the above cordierite crystal-containing sintered body is produced by mixing a borosilicate glass powder containing, for example, $SiO_2$, $Al_2O_3$, MgO, ZnO and $B_2O_3$, a cordierite powder and, as required, a powder of alumina, gahnite, mullite, forsterite or zirconia so as to possess the above-mentioned composition, mixing the above mixed powder with an organic binder or a solvent according to a customary method to prepare a slurry thereof, forming a ceramic green sheet using the above slurry, laminating, as required, the sheet in a plurality of number of pieces, and firing the laminate in the atmosphere or in a nitrogen atmosphere at a temperature of 700 to 1000° C. Therefore, the first wiring board 1 comprising the first insulated substrate $1b$ is easily produced by forming a predetermined wiring pattern (wiring layer $1a$) on a ceramic green sheet by using a predetermined conducting paste in the above step of producing the first insulated substrate $1b$.

Second Insulated Substrate $2b$:

It is necessary that the coefficient $\alpha_2$ of thermal expansion of the second insulated substrate $2b$ in the second wiring board 2 satisfies the above-mentioned conditions, and is not smaller than $8\times10^{-6}/°$ C., preferably, not smaller than $9\times10^{-6}/°$ C. and, most preferably, not smaller than $10\times10^{-6}/°$ C. from the standpoint of maintaining a highly reliable secondary mounting. Namely, the coefficient $\alpha_2$ of thermal expansion lying in such a high range makes it possible to decrease thermal stress generated due to a difference in the coefficient of thermal expansion between the external circuit board and the second insulated substrate $2b$ and, hence, to obtain the highly reliable secondary mounting.

In the second insulated substrate $2b$, too, it is desired that the dielectric constant capacity is not larger than 7, preferably, not larger than 6.5 and, most preferably, not larger than 6 like that of the first insulated substrate $1b$.

It is further desired that the second insulated substrate $2b$ has a Young's modulus which is not larger than 150 GPa, preferably, not larger than 145 GPa and, most preferably, not larger than 140 GPa. The insulated substrate having such a low Young's modulus is subject to be deformed as compared to an alumina substrate having a Young's modulus of as high as about 300 GPa, works to relax the thermal stress relative to the external circuit board such as a printed board to a conspicuous degree, and improves the long-time connection reliability relative thereto.

It is further desired that the second insulated substrate 2b has a thickness $t_2$ of not smaller than 0.5 mm, preferably, not smaller than 0.7 mm and, most preferably, not smaller than 0.9 mm. As described above, with the mounting structure mounting the laminated wiring board A on the external circuit board that will be described later, the second wiring board 2 comprising the second insulated substrate 2b is often warped due to a difference in the coefficient of thermal expansion between the first insulated substrate 1b and the external circuit board or the second insulated substrate 2b. With the thickness of the second insulated substrate 2b being set to lie within the above range, however, the warping of the second wiring board 2 can be effectively suppressed, and the long-time connection reliability of the connecting electrodes 5 can be further enhanced between the two wiring boards 1 and 2. Moreover, the warping of the first wiring board 1 itself caused by a difference in the coefficient of thermal expansion can be effectively suppressed. When the electric device is mounted on the first wiring board 1, therefore, stress generating under the electric device is relaxed, and the electric device itself is prevented from being destroyed.

In the laminated wiring board of the present invention, further, it is desired that the ratio of the surface area (S1) of the first wiring board 1 to the surface area (S2) of the second wiring board 2 is (S1/S2)≦0.3, preferably, (S1/S2)≦0.25 and, most preferably, (S1/S2)≦0.2.

In the present invention, it is desired that the first insulated substrate 1b having properties such as the above coefficient of thermal expansion and dielectric constant is made of low-firing ceramics that can be fired at not higher than 1000° C. and is, particularly, made of a glass ceramic sintered body obtained by firing a glass alone or the glass and a ceramic filler in combination from the standpoint of easily controlling the properties. In particular, a sintered body obtained by firing the glass and the ceramic filler (e.g., cordierite, alumina, gahnite, mullite, forsterite, zirconia, etc.) is best suited as a material for forming the first insulated substrate 1b since it makes it easy to adjust the properties such as the coefficient of thermal expansion and the dielectric constant upon adjusting the amount of blending the ceramic filler.

For example, in order to set the coefficient $\alpha_2$ of thermal expansion to be not smaller than $7\times10^{-6}$/° C., it is desired that the glass ceramic sintered body contains a silicate crystal phase such as an alkali metal silicate, an alkaline earth metal silicate, or a silicate containing both an alkali metal and an alkaline earth metal. Namely, the silicate crystals are advantageous for increasing the coefficient of thermal expansion of a sintered body. Among them, it is particularly desired to use at least one of lithium silicate, enstatite, forsterite or barium silicate. The silicate crystal-containing sintered body generally contains Si, Mg, Ca, Al, Li and O as constituent elements and, further, contains Pb in an amount of not larger than 0.1 mass % and, particularly, not larger than 0.01 mass % calculated as an oxide thereof from the environmental point of view. Namely, Si and O are principal constituent elements of the silicate crystals. Upon being combined with an alkali metal or alkaline earth metal oxide of Mg, Ca, Li, there are formed silicate crystals having a high coefficient $\alpha_2$ of thermal expansion to accomplish a desired coefficient of thermal expansion. Aluminum is a component desired for improving the resistance against chemicals and mechanical strength of the sintered body. When used in too large amounts, aluminum dissolves in the silicate crystals as a solid solution to form a composite oxide having a small coefficient of thermal expansion. For instance, spodumene is formed by the lithium silicate and $Al_2O_3$, cordierite is formed by the enstatite and $Al_2O_3$, and celsian is formed by the barium silicate and $Al_2O_3$.

It is therefore desired that the contents of the above elements lie within predetermined ranges and that the silicate crystal-containing sintered body has a composition containing, calculated as oxides, 45 to 80 mass % of $SiO_2$, 2 to 35 mass % of MgO, 1 to 20 mass % of CaO, 1 to 10 mass % of $Al_2O_3$, and 1 to 10 mass % of $Li_2O$. Upon containing quartz as a crystal phase, it is allowed to further increase the coefficient of thermal expansion and to lower the dielectric constant and Young's modulus. The sintered body may further contain a component stemming from a sintering assistant or a glass, e.g., at least one component selected from the group consisting of $K_2O$, BaO, SrO and $ZrO_2$ in an amount of not larger than 15 mass %. The assistant makes it possible to obtain a densely sintered body containing little voids.

The second insulated substrate 2b comprising the above silicate crystal-containing sintered body is produced by mixing a glass powder containing, for example, $SiO_2$, MgO, CaO, $Al_2O_3$ and $Li_2O$ in predetermined amounts and, as required, $K_2O$, BaO, SrO and $ZrO_2$, and various silicate type filler powders so as to possess the above-mentioned composition, mixing the above mixed powder with an organic binder or a solvent according to a customary method to prepare a slurry thereof, forming a ceramic green sheet using the above slurry, laminating, as required, the sheet in a plurality of number of pieces, and firing the laminate in the atmosphere or in a nitrogen atmosphere at a temperature of 700 to 1000° C. Therefore, the second wiring board 2 comprising the second insulated substrate 2b is easily produced by forming a predetermined wiring pattern (wiring layer 2a) on a ceramic green sheet by using a predetermined conducting paste in the above step of producing the second insulated substrate 2b.

First wiring board 1 and second wiring board 2:

In the present invention, the first wiring board 1 forming the wiring layer 1a on the first insulated substrate 1b is considerably smaller than the second wiring board 2 forming the wiring layer 2a on the second insulated substrate 2b. Concretely, the ratio of the area $S_1$ of the lower surface of the first wiring board 1 (substantially the same as the area of the upper surface) to the area $S_2$ of the upper surface of the second wiring board 2 (substantially the same as the area of the lower surface) is not larger than 0.3, preferably, not larger than 0.25 and, most preferably, not larger than 0.2. That is, by decreasing the size of the first wiring board 1 to be smaller than the second wiring board 2 by more than a predetermined ratio, it is allowed to decrease the distortion caused by a difference in the coefficient of thermal expansion between the two. As a result, thermal stress can be decreased and long-time connection reliability of the laminated wiring board A can be maintained.

Connecting Electrodes 5:

The connecting electrodes 5 may be made of a variety of electrically conducting materials provided electric connection is maintained between the wiring layer 1a and the wiring layer 2a. In particular, it is desired that the connecting electrodes contain a solder as a chief component. Therefore, the connecting electrodes 5 may preferably be, for example, solder balls, high-temperature solder balls or resin-containing conductive balls of which the surfaces of the spherical resin balls are coated with the solder. Further, the connecting electrodes 5 may assume the shape of a barrel of which the central barrel portions are swollen. When the first wiring board 1 and the second wiring board 2 are joined together by using the connecting electrodes 5, the height of the connecting portion (gap between the first wiring board 1 and the second wiring board 2) can be increased without decreasing the strength. Therefore, stress concentrated in the connecting electrodes 5 can be relaxed to maintain improved connection reliability. When, for example, a thin solder layer formed by printing is used as the connecting electrodes 5, stress concentrates in the connecting electrodes 5 and the connection reliability decreases. If melted by heat and adhered, then, the ball-shaped connecting electrodes 5 such as solder balls assume a barrel shape with their central barrel portions being swollen.

In the above laminated wiring board, it is desired that the organic resin constituting the connecting electrodes is a thermosetting resin or a photo (ultraviolet ray)-curable resin that is cured, that the conductive substance is at least the one selected from the group consisting of conductive resin, carbon and a metal, and that the conductive material layer has a thickness of not smaller than 5 μm and a Young's modulus of not larger than 30 GPa.

Sealing Agent 7:

In the laminated wiring board A of the present invention as described earlier, it is desired that the sealing agent 7 is filled between the first wiring board 1 and the second wiring board 2, and the connecting electrodes 5 are buried in the sealing agent 7. The sealing agent is also called under-filling agent and contains a thermosetting resin (e.g., polyimide resin) as an organic resin. An inorganic filler such as quartz glass is dispersed in the organic resin. By burying the connecting electrodes 5 in the sealing agent 7, stress between the two wiring substrates 1 and 2 can be relaxed while firmly adhering the first wiring board 1 and the second wiring board 2 together, and a highly reliable connection is accomplished.

Further, the sealing agent 7 exhibits an increasing effect for relaxing the stress as the Young's modulus decreases, and a highly reliable connection is accomplished. It is therefore desired to decrease the content of the inorganic filler (which is usually added for lowering the coefficient of thermal expansion) in the sealing agent 7 as much as possible. Desirably, the content of the inorganic filler is decreased down to be not larger than 90% by weight.

[Electric Device-Mounting Laminated Wiring Board]

Figure 2:
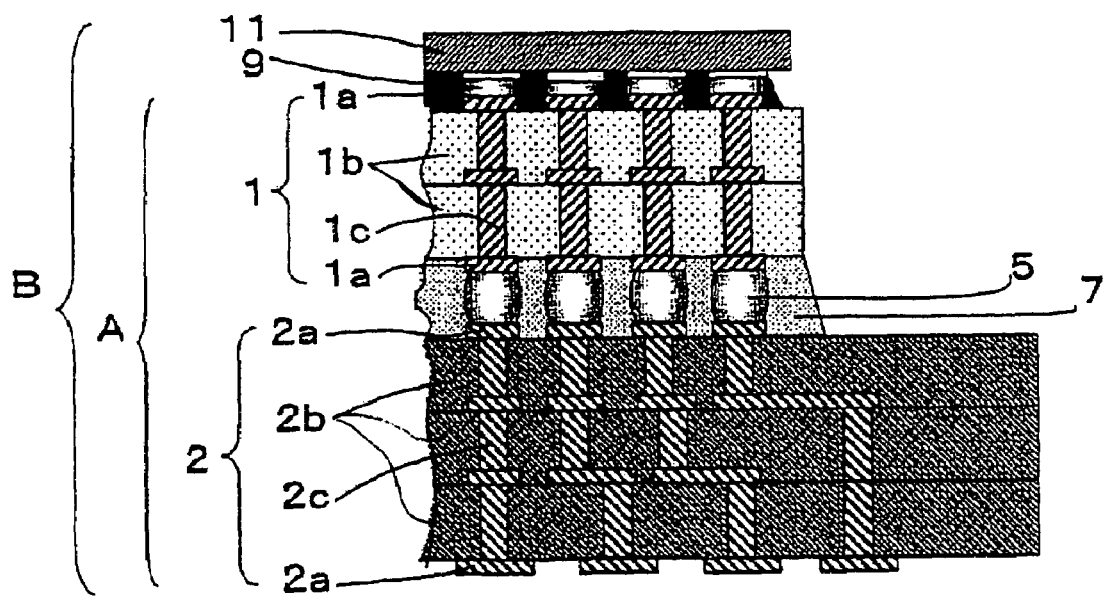
FIG. 2 is a sectional view schematically illustrating a package in which an electric device is mounted on the laminated wiring board of FIG. 1.

As described already, the laminated wiring board A of the invention is usually put to use mounting an electric device thereon. FIG. 2 illustrates a structure of the laminated wiring board (hereinafter referred to as package) mounting the electric device.

Referring to FIG. 2, the package which is generally designated as B is constituted by mounting an electric device 11 (primary mounting) on the upper surface of the laminated wiring board A of the above structure (upper surface of the first wiring board 1) via a plurality of connecting portions 9. As the electric device 11, there can be used semiconductor devices comprising chiefly semiconductors as represented by element semiconductors such as silicon and germanium, compound semiconductors such as GaAs, GaP, and oxide semiconductors such as $SnO_2$ and ZnO, as well as devices of the solid structure type such as MEMS.

In the above package B, the material of the first insulated substrate 1b should be selected depending upon the material of the electric device 11 that is used, so that a difference ($\alpha_1 - \alpha_3$) between the coefficient $\alpha_1$ of thermal expansion of the first insulated substrate 1b in the first wiring board 1 and the coefficient $\alpha_3$ of thermal expansion of the electric device 11 becomes not larger than $5 \times 10^{-6}/°$ C., preferably, not larger than $4 \times 10^{-6}/°$ C. and, most preferably, not larger than $2 \times 10^{-6}/°$ C. Namely, by decreasing the difference in the coefficient of thermal expansion between the electric element 11 and the laminated wiring board A, thermal stress acting on the two members can be decreased. For example, even when there is used, as the electric device 11, a semiconductor device having poor mechanical resistance including a porous insulating film ($SiO_2$ film, etc.) having a low dielectric constant, the electric device 11 is prevented from being destroyed by the thermal stress, and a long-time reliability of the primary mounting can be secured.

In the package B of the present invention, therefore, it is desired that the coefficient $\alpha_3$ of thermal expansion of the electric device 11 is not larger than $4 \times 10^{-6}/°$ C. and, preferably, not larger than $3.5 \times 10^{-6}/°$ C. and, particularly, that a silicon semiconductor device comprising chiefly silicon and having a porous insulating film of a low dielectric constant is used as the electric device 11. By using the above electric device 11, it is allowed to obtain a package B exhibiting excellent long-time reliability and suited for processing high-speed signals. That is, the above electric device 11 may have a very low mechanical resistance. According to the present invention, however, long-time reliability is maintained in the primary mounting and in the secondary mounting even when the above electric device 11 is mounted on the above laminated wiring board A to constitute the package B.

In the invention, further, it is desired that the area $D_1$ (total area of the lower surface of the electric device 11) of a portion mounting the electric device 11 of the first wiring board 1 is not smaller than 50 $mm^2$. This enables many electric devices 11 to be mounted to increase the degree of integration and to enhance the performance of the package B. It is further desired that a ratio ($S_3/D_1$) of the area $S_3$ of the upper surface of the first wiring board 1 mounting the electric device 11 (substantially the same as the area $S_1$ of the lower surface mentioned above) to the above-mentioned area $D_1$ is 1 to 1.5, preferably, 1 to 1.4 and, more preferably, 1 to 1.3. When the size of the first wiring board 1 is so set that the area ratio ($S_3/D_1$) lies in the above range, the area of the first wiring board 1 of a portion facing the second wiring board 2 becomes small relative to that of the second wiring board to further decrease the thermal stress occurring between the first wiring board 1 and the second wiring board 2 and, hence, further enhancing the long-time reliability of the connecting portions 9 of the laminated wiring board A. Besides, the size of the first wiring board 1 can be further decreased and it is expected that the cost can be decreased.

The electric device 11 is electrically connected to the wiring layer 1a on the upper surface of the first wiring board 1 through the connecting portions 9. Here, it is desired that the connecting portions 9 contain a solder as a chief component like the above-mentioned connecting electrodes 5 and are desirably formed by using, for example, solder bumps. In order to relax the stress in the connecting portions 9, further, it is desired that the connecting portions 9 are buried in the sealing agent that contains an organic resin like the case of the connecting electrodes 5. In the example of FIG. 2, the connecting portions 9 are shown in the form of a flip chip mounting. As required, however, the connecting portions 9 can be formed by bonding the wires.

[Mounting Structure of the Package]

Figure 3:
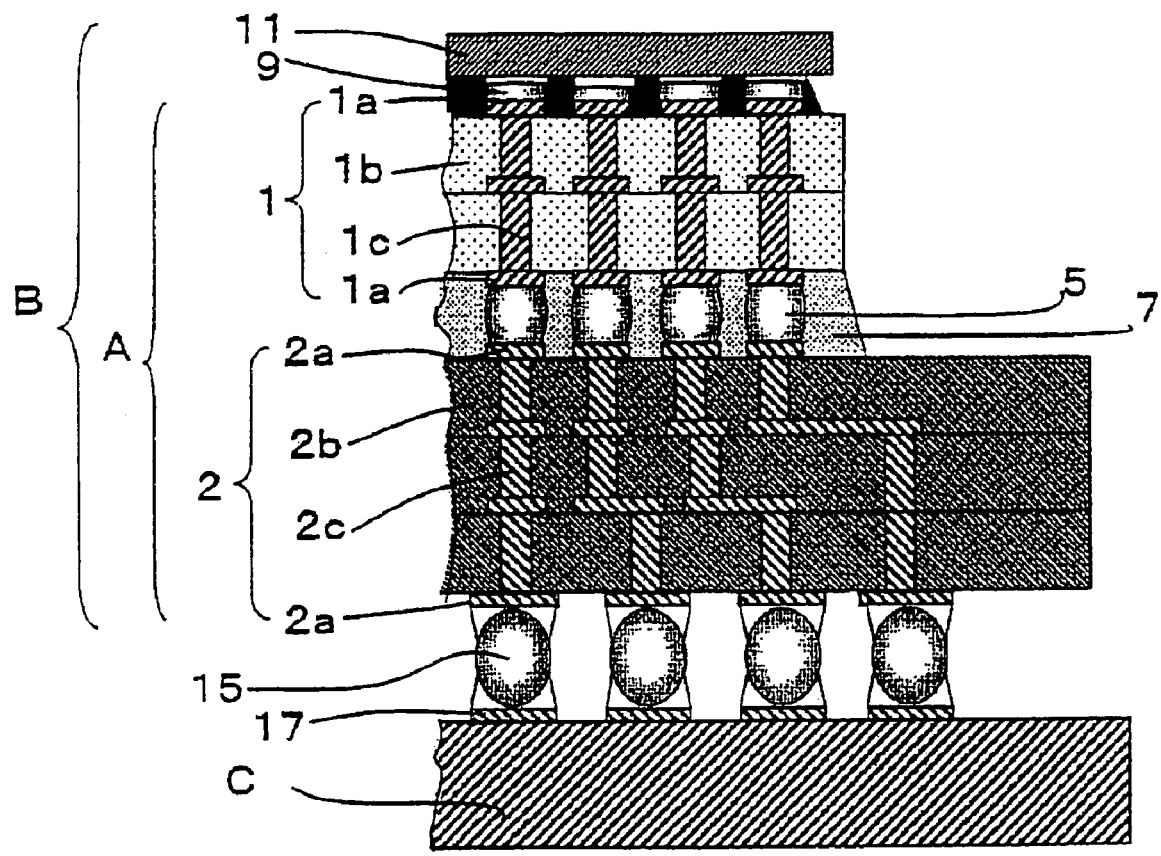
FIG. 3 is a sectional view schematically illustrating a mounting structure by which an external circuit board is mounted on the package of FIG. 1.
Figure 4:
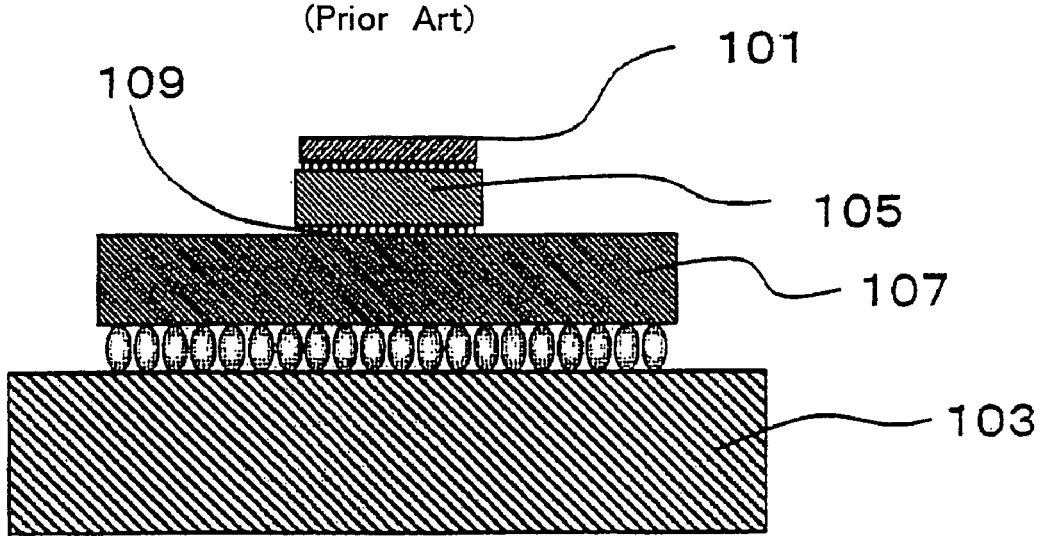
FIG. 4 is a sectional view schematically illustrating a conventional laminated wiring board.

The package B having the electric device 11 mounted on the laminated wiring board A is secondarily mounted on the external circuit board. FIG. 3 illustrates a mounting structure.

In the mounting structure of FIG. 3, the package B is secondarily mounted on the external circuit board generally designated at C via a plurality of connecting electrodes 15. Namely, the external circuit board C has wirings 17 of a metal conductor such as Cu, Au, Al, Ni or Pb-Sn formed on the upper surface of an insulated substrate, and the wiring layers 2a on the lower surface of the second wiring board 2 are electrically connected to the wirings 17 via the connecting electrodes 15. In the mounting structure, further, the second insulated substrate 2b and the external circuit board C should be so combined together that a difference ($\alpha_4 - \alpha_2$) between the coefficient $\alpha_2$ of thermal expansion of the second insulated substrate 2b in the second wiring board 2 and the coefficient $\alpha_4$ of thermal expansion of the external circuit board C (insulated substrate) is not larger than $12 \times 10^{-6}/°$ C., preferably, not larger than $10 \times 10^{-6}/°$ C. and, most preferably, not larger than $8 \times 10^{-6}/°$ C. This decreases the thermal stress generated due to a difference in the coefficient of thermal expansion between the second wiring board 2 and the external circuit board C to maintain long-time connection reliability of the secondary mounting. When, for example, the above difference ($\alpha_4 - \alpha_2$) in the coefficient of thermal expansion is larger than $12 \times 10^{-6}/°$ C., too great thermal stress builds up between the second wiring board 2 and the external circuit board C, whereby the connecting electrodes 15 tend to be cracked and, finally, the connecting electrodes 15 are broken down spoiling long-time connection reliability and losing practicability.

In the above mounting structure, a printed board is desired as the external circuit board C. In general, the printed board is made of an organic resin-containing insulating material having a coefficient $\alpha_4$ of thermal expansion in a range of 14 to $20 \times 10^{-6}/°$ C., such as a glass-epoxy composite material.

It is further desired that the connecting electrodes 15 contain a solder as a chief component like the connecting electrodes 5 and, particularly, have a ball-like or pole-like shape. It is further allowable to use the connecting terminals of the socket type equipped with a metallic pin as the connecting electrodes 15. Namely, the connecting electrodes 15 work to increase the height relaxing the stress concentrated in the interface between the connecting electrodes 15 and the wiring layers 2a or the wirings 17 and maintaining higher connection reliability.

In the above mounting structure, it is desired that the melting point decreases in order of the connecting electrodes 5, connecting portions 9 and connecting electrodes 15. Namely, the above mounting structure is obtained by joining the first wiring board 1 and the second wiring board 2 together using the connecting electrodes 5, joining, next, the first wiring board 1 and the electric device 11 together using the connecting portions 9 and, finally, joining the second wiring board 2 and the external circuit board C together using the connecting electrodes 15. By lowering the melting point in order of the connecting electrodes 5, connecting portions 9 and connecting electrodes 15 as described above, therefore, the connecting electrodes 5 or the connecting portions 9 are not melted again in the junction at a subsequent step and the wires are not broken.

EXAMPLES (Experiment 1)

In order to make sure the effect of the laminated wiring board of the invention, a laminated wiring board for evaluation was prepared as described below.

As insulating materials for forming the first insulated substrate and the second insulated substrate, there were selected a printed substrate having a coefficient of thermal expansion of $16 \times 10^{-6}/°$ C., an alumina substrate having a coefficient of thermal expansion of $5.9 \times 10^{-6}/°$ C. and glass ceramics A to E shown in Table 1 to prepare first wiring boards (first insulated substrates having a thickness of 0.4 mm and a surface area $S_1$ of 150 mm$^2$) and second wiring boards (second insulated substrates having a thickness of 1 mm and a surface area $S_2$ of 1600 mm$^2$) having properties as shown in Tables 2 and 3.

A eutectic solder paste containing 36 mass % of Pb and 64 mass % of Sn was printed on the wiring layers on the upper surfaces and on the lower surfaces of the first wiring boards and of the second wiring boards by a printing method. The connecting electrodes having a diameter of 0.2 mm were arranged like a matrix maintaining a distance between the centers of electrodes of 0.35 mm.

Further, as the connecting electrodes 5, eutectic solder balls of a diameter of 0.2 mm were placed on the solder layers printed on the upper surfaces of the second wiring boards and the first wiring substrate was placed thereon in position followed by reflow treatment. Then, a sealing agent was injected into a gap between the first wiring boards and the second wiring boards according to Tables 2 and 3, and was cured to obtain laminated wiring boards (samples Nos. 1 to 19). Without using the eutectic solder balls, further, a laminated wiring board was obtained by directly joining the first wiring board and the second wiring board relying on the solder-printed layer (sample No. 20).

Then, an electric device (semiconductor device) for evaluation-comprising chiefly silicon having a coefficient $\alpha_3$ of thermal expansion of $2.5 \times 10^{-6}/°$ C. with a porous insulating film of a low dielectric constant and having an area $D_1$ of the lower surface thereof of 100 mm$^2$, was placed in position on the first wiring boards of the laminated wiring boards prepared above via the solder of a thickness of 0.1 mm followed by the reflow treatment. Then, a filler was injected into a gap between the electric device and the first wiring board according to Tables 2 and 3, and was cured to obtain packages in which the electric device was flip chip-mounted (primary mounting).

There was further prepared, as an external circuit board, a printed board (coefficient $\alpha_4$ of thermal expansion of $16 \times 10^{-6}/°$ C.) forming on the surface thereof a wiring having the same pattern as that of the wiring layer on the back surface of the second wiring board, and a eutectic solder past was printed on the wiring of the printed board by a printing method. The printed solder layer possessed a diameter of 0.8 mm and a distance between the centers thereof of 1.3 mm.

Then, high-temperature solder balls of a diameter of 0.8 mm were placed on the printed boards in position, and the packages obtained above were placed thereon in position, followed by the reflow treatment again to mount the packages on the printed boards. Thus, there were prepared the samples for evaluating the primary mounting and the secondary mounting each in a number of 20.

Next, the samples for evaluating the mounting were put to the temperature cycle testing over a temperature range of 0 to 100° C. up to 2000 cycles to make sure the occurrence of breakage in the electric device every after 100 cycles. Further, the electric resistance was measured at three places, i.e., on the primary mounting side, secondary mounting side and in the laminated wiring board. Thereafter, the ultrasonic flow detection was effected to make sure the presence of breakage of wire. Breakage to the electric device and the number of cycles when broken were as shown in Table 3. The product was regarded to be acceptable when there was no breakage to the electric device or to the wires up to 1000 cycles.

TABLE 1

| Glass ceramic | Coefficient of thermal expansion ($\times 10^{-6}/°C$) | Glass powder (mass %) | | | | | | | Amount of glass powder | Ceramic powder (mass %) | | | | |
|---|---|---|---|---|---|---|---|---|---|---|---|---|---|---|
| | | $SiO_2$ | $Al_2O_3$ | $B_2O_3$ | MgO | CaO | BaO | ZnO | | Alumina | Cordierite | $CaZrO_3$ | $SrSiO_3$ | Quartz |
| A | 2.8 | 44 | 29 | 9 | 11 | 0 | 0 | 7 | 72 | 20 | 5 | 3 | 0 | 0 |
| B | 4.6 | 44 | 29 | 9 | 11 | 0 | 0 | 7 | 75 | 25 | 0 | 0 | 0 | 0 |
| C | 6.2 | 44 | 29 | 9 | 11 | 0 | 0 | 7 | 64 | 0 | 0 | 5 | 17 | 14 |
| D | 8.2 | 50 | 5 | 0 | 19 | 26 | 0 | 0 | 60 | 40 | 0 | 0 | 0 | 0 |
| E | 10.6 | 45 | 7 | 13 | 0 | 12 | 23 | 0 | 50 | 0 | 0 | 0 | 0 | 50 |

TABLE 2

| | First wiring board | | | | |
|---|---|---|---|---|---|
| Sample No. | Material | α1 ($\times 10^{-6}/°C$) | Dielectric constant | Wiring layer | Area (S3) |
| *1 | printed board | 16 | 4.5 | copper | 100 |
| *2 | alumina | 5.9 | 9.1 | tungsten | 100 |
| *3 | A | 2.8 | 5.6 | copper | 100 |
| *4 | alumina | 2.9 | 9.1 | tungsten | 100 |
| *5 | printed board | 16 | 4.5 | copper | 100 |
| 6 | A | 2.8 | 5.6 | copper | 100 |
| 7 | A | 2.8 | 5.6 | copper | 100 |
| 8 | B | 4.6 | 5.5 | copper | 100 |
| 9 | C | 6.2 | 5.6 | copper | 100 |
| 10 | A | 2.8 | 5.6 | copper | 150 |
| 11 | B | 4.6 | 5.6 | copper | 130 |
| 12 | B | 4.6 | 5.6 | copper | 150 |
| 13 | B | 4.6 | 5.6 | copper | 170 |
| 14 | A | 2.8 | 5.6 | copper | 100 |
| 15 | A | 2.8 | 5.6 | copper | 100 |
| 16 | B | 4.6 | 5.5 | copper | 100 |
| 17 | B | 4.6 | 5.5 | copper | 100 |
| 18 | A | 2.8 | 5.6 | copper | 100 |
| 19 | alumina | 5.9 | 9.1 | tungsten | 100 |
| 20 | alumina | 5.9 | 9.1 | tungsten | 100 |

| | Second wiring board | | | | | |
|---|---|---|---|---|---|---|
| Sample No. | Material | α2 ($\times 10^{-6}/°C$) | Dielectric constant | Young's modulus (Gpa) | Wiring layer | Connecting electrodes |
| *1 | printed board | 16 | 4.5 | 10 | copper | with solder balls |
| *2 | printed board | 16 | 4.5 | 10 | copper | with solder balls |
| *3 | printed board | 16 | 4.5 | 10 | copper | with solder balls |
| *4 | A | 2.8 | 5.6 | 130 | copper | with solder balls |
| *5 | A | 2.8 | 5.6 | 130 | copper | with solder balls |
| 6 | alumina | 5.9 | 9.1 | 300 | tungsten | with solder balls |
| 7 | E | 10.6 | 5.6 | 80 | copper | with solder balls |
| 8 | E | 10.6 | 5.6 | 80 | copper | with solder balls |
| 9 | E | 10.6 | 5.6 | 80 | copper | with solder balls |
| 10 | E | 10.6 | 5.6 | 80 | copper | with solder balls |
| 11 | E | 10.6 | 5.6 | 80 | copper | with solder balls |
| 12 | E | 10.6 | 5.6 | 80 | copper | with solder balls |
| 13 | E | 10.6 | 5.6 | 80 | copper | with solder balls |
| 14 | E | 10.6 | 5.6 | 80 | copper | with solder balls |
| 15 | E | 10.6 | 5.6 | 80 | copper | with solder balls |
| 16 | E | 10.6 | 5.6 | 80 | copper | with solder balls |
| 17 | E | 10.6 | 5.6 | 80 | copper | with solder balls |
| 18 | D | 8.2 | 5.6 | 149 | copper | with solder balls |
| 19 | E | 10.6 | 5.6 | 80 | copper | with solder balls |
| 20 | E | 10.6 | 5.6 | 80 | copper | without solder balls |

Samples marked with * lie outside the scope of the invention.

TABLE 3

| Sample No. | Difference ($\times 10^{-6}$/° C.) in the coefficient of thermal expansion | | | Sealing agent | | Area ratio (S3/D1) | Temperature cycle No. (cycles) | | |
|---|---|---|---|---|---|---|---|---|---|
| | $\alpha 3 - \alpha 1$ | $\alpha 2 - \alpha 1$ | $\alpha 4 - \alpha 2$ | Primary mount | Connecting portion of laminated board | | primary mount | Laminated wiring board | 2ndary mount |
| *1 | 13.5 | 0 | 0 | yes | yes | 1 | 100 | >2000 | >2000 |
| *2 | 3.4 | 10.1 | 0 | yes | yes | 1 | 1200 | 900 | >2000 |
| *3 | 0.3 | 13.2 | 0 | yes | yes | 1 | >2000 | 300 | >2000 |
| *4 | 3.4 | −3.1 | 13.2 | yes | yes | 1 | 1000 | 100 | 900 |
| *5 | 13.5 | −13.2 | 13.2 | yes | yes | 1 | 100 | 100 | 700 |
| 6 | 0.3 | 3.1 | 10.1 | yes | yes | 1 | >2000 | >2000 | 1400 |
| 7 | 0.3 | 7.8 | 5.4 | yes | yes | 1 | >2000 | >2000 | >2000 |
| 8 | 2.1 | 6 | 5.4 | yes | yes | 1 | 2000 | >2000 | >2000 |
| 9 | 3.7 | 4.4 | 5.4 | yes | yes | 1 | 1800 | >2000 | >2000 |
| 10 | 0.3 | 7.8 | 5.4 | yes | yes | 1.5 | >2000 | >2000 | >2000 |
| 11 | 2.1 | 6 | 5.4 | yes | yes | 1.3 | 2000 | >2000 | >2000 |
| 12 | 2.1 | 6 | 5.4 | yes | yes | 1.5 | 2000 | 1900 | >2000 |
| 13 | 2.1 | 6 | 5.4 | yes | yes | 1.7 | 2000 | 1800 | >2000 |
| 14 | 0.3 | 7.8 | 5.4 | yes | no | 1 | >2000 | >2000 | >2000 |
| 15 | 0.3 | 7.8 | 5.4 | no | yes | 1 | >2000 | >2000 | >2000 |
| 16 | 2.1 | 6 | 5.4 | yes | no | 1 | 1900 | 1800 | >2000 |
| 17 | 2.1 | 6 | 5.4 | no | yes | 1 | 1700 | >2000 | >2000 |
| 18 | 0.3 | 5.4 | 7.8 | yes | yes | 1 | >2000 | >2000 | >2000 |
| 19 | 3.4 | 4.7 | 5.4 | yes | yes | 1 | 1200 | >2000 | >2000 |
| 20 | 3.4 | 4.7 | 5.4 | yes | yes | 1 | 1200 | 1500 | >2000 |

Samples marked with * lie outside the scope of the invention.

As will be obvious from the results of Tables 2 and 3, in the case of the mounting structures of samples Nos. 6 to 20 in which the coefficient $\alpha_1$ of thermal expansion of the first insulating board was smaller than the coefficient $\alpha_2$ of thermal expansion of the second insulating board, the difference ($\alpha_2 - \alpha_1$) in the coefficient of thermal expansion between the two was not larger than $9 \times 10^{-6}$/° C., the difference between the coefficient $\alpha_1$ of thermal expansion and the coefficient $\alpha_3$ of thermal expansion of the electric device was not larger than $5 \times 10^6$/° C., and the difference between the coefficient $\alpha_2$ of thermal expansion and the coefficient $\alpha_4$ of thermal expansion of the printed board was not larger than $12 \times 10^{-6}$/° C. as contemplated by the present invention, the temperature cycle number was not smaller than 1200 cycles in the primary mounting portion, was not smaller than 1500 cycles in the laminated wiring board, and was not smaller than 1400 cycles in the secondary mounting portion, lending themselves well for processing high-speed signals, offering high reliability in the primary mounting and high reliability in the secondary mounting, and maintaining reliable connection between the two wiring boards.

In the samples Nos. 6 to 19 using solder balls of a barrel shape as connecting electrodes in the laminated wiring boards, in particular, the temperature cycle number was not smaller than 1200 cycles in the primary mounting portion, was not smaller than 1400 cycles in the secondary mounting portion, and was not smaller than 1800 cycles in the laminated wiring boards.

In the samples Nos. 4 and 5 in which the coefficient $\alpha_1$ of thermal expansion of the first insulated substrate was greater than the coefficient $\alpha_2$ of thermal expansion of the second insulated substrate, stress concentrated to a conspicuous degree in the connecting portions of the laminated wiring board. As a result, the connecting portions were broken after a temperature cycle number of not larger than 1000 cycles. In the samples Nos. 2 and 3 in which the difference between the coefficient $\alpha_1$ of thermal expansion and the coefficient $\alpha_2$ of thermal expansion was not smaller than $9 \times 10^{-6}$/° C., stress occurred to an excess degree in the connecting portions of the laminated wiring board, and the connecting portions were broken after a temperature cycle number of not larger than 1000 cycles.

In the samples Nos. 1 and 5 in which the difference between coefficient $\alpha_3$ of thermal expansion of the semiconductor device and the coefficient $\alpha_1$ of thermal expansion of the first insulated substrate was not smaller than $7 \times 10^{-6}$/° C., stress concentrated to a conspicuous degree in the semiconductor device. Therefore, the semiconductor device was broken after a temperature cycle number of not larger than 1000 cycles. In the samples Nos. 4 and 5 in which the difference between the coefficient $\alpha_2$ of thermal expansion of the second insulated substrate and the coefficient $\alpha_4$ of thermal expansion of the printed board was not smaller than $12 \times 10^{-6}$/° C., stress occurred to an excess degree in the connecting portions on the secondary mounting side, and the connecting portions were broken after a temperature cycle number of not larger than 1000 cycles.

(Experiment 2)

First wiring boards (0.4 mm thick) comprising first insulated substrates (GC1 to GC10) having the same wiring layer as that of Experiment 1 and having a thickness of 0.4 mm were obtained by using glasses (G1 go G4) of compositions shown in Table 4 and using filler powders shown in Table 5, and conducting the firing under the conditions shown in Table 5.

There was further prepared a second wiring board (having a thickness of 1 mm and a surface area $S_2$ of 1600 mm$^2$) comprising a second insulated substrate obtained by firing a mixed powder of 50 mass % of a ceramic filler and 50 mass % of a glass powder containing 45 mass % of $SiO_2$, 7 mass % of $Al_2O_3$, 13 mass % of $B_2O_3$, 12 mass % of CaO and 23 mass % of BaO, and further having the same wiring layer as that of Experiment 1.

The first wiring boards and the second wiring boards were combined as shown in Table 6 to obtain laminated wiring boards in quite the same manner as in Experiment 1. Onto the laminated wiring boards A were flip chip-mounted (primary mounting) the silicon semiconductor devices to obtain packages B. The packages B were secondarily mounted on the printed boards to obtain samples for evaluating the primary mounting and the secondary mounting each in a number of 20. The samples were evaluated in quite the same manner as in the Experiment 1. The results were as shown in Table 7.

TABLE 4

| | Glass composition (mass %) | | | | | | | |
|---|---|---|---|---|---|---|---|---|
| | $SiO_2$ | $Al_2O_3$ | MgO | ZnO | $B_2O_3$ | CaO | BaO | $ZrO_2$ |
| G1 | 44 | 29 | 11 | 7 | 9 | 0 | 0 | 0 |
| G2 | 45 | 22 | 18 | 6 | 9 | 0 | 0 | 0 |
| G3 | 44 | 25 | 11 | 5 | 5 | 6 | 2 | 2 |
| G4 | 50 | 5 | 18 | 0 | 0 | 27 | 0 | 0 |

TABLE 5

| Sample No. | Cordierite Glass powder Kind | Cordierite Glass powder Mass % | Cordierite powder Mass % | Filler powder Kind | Filler powder Mass % | Firing condition Temp. (°C.) | Firing condition Time (hr) | Coefficient of thermal expansion ($\times 10^{-6}$/°C.) | Dielectric constant | Precipitated crystal phase |
|---|---|---|---|---|---|---|---|---|---|---|
| *GC1 | G1 | 75 | 0 | alumina | 25 | 950 | 1 | 5.2 | 5.5 | AL > Ga > Co > Mu |
| GC2 | G1 | 77.5 | 2.5 | alumina | 17.5 | 950 | 1 | 2.8 | 5.7 | An > AL > Ga > ZO |
| | | | | $CaZrO_3$ | 2.5 | | | | | |
| GC3 | G1 | 87.5 | 2.5 | mullite | 10 | 950 | 1 | 2.5 | 5.3 | Co > Mu > Ga |
| GC4 | G2 | 87.5 | 2.5 | forsterite | 10 | 900 | 1 | 2.9 | 5.6 | Co > Ga > Fo |
| GC5 | G2 | 77 | 5 | alumina | 15 | 900 | 1 | 2.7 | 5.5 | Co > AL > Ga > ZO |
| | | | | $CaZrO_3$ | 3 | | | | | |
| GC6 | G2 | 72 | 5 | alumina | 20 | 900 | 1 | 2.8 | 5.6 | Co > AL > Ga > ZO |
| | | | | $CaZrO_3$ | 3 | | | | | |
| GC7 | G2 | 72 | 5 | alumina | 20 | 900 | 1 | 2.6 | 5.5 | Co > AL > Ga |
| | | | | $CaSiO_3$ | 3 | | | | | |
| GC8 | G3 | 77 | 5 | alumina | 15 | 900 | 1 | 2.7 | 5.7 | Co > AL > Ga > ZO |
| | | | | $CaZrO_3$ | 3 | | | | | |
| *GC9 | G4 | 60 | 0 | alumina | 40 | 900 | 1 | 7.4 | 7.7 | DI > AL |
| *GC10 | G4 | 62.5 | 2.5 | alumina | 35 | 900 | 1 | 7.2 | 7.6 | DI > AL > Co |

Note 1)
Samples marked with * lie outside the preferably embodiment of the invention.

Note 2)
Co: cordierite AL: alumina Mu: mullite Ga: gahnite ZO: zirconia Fo: forsterite DI: diopsite

TABLE 6

| | First wiring board | | | | | Second wiring board | | | | |
|---|---|---|---|---|---|---|---|---|---|---|
| Sample No. | Material | α1 ($\times 10^{-6}$/°C.) | Dielectric constant | Wiring layer | Area (S1) | Material | α2 ($\times 10^{-6}$/°C.) | Dielectric constant | Young's modulus | Wiring layer |
| 1 | GC1 | 5.2 | 5.5 | copper | 100 | glass ceramic | 10.6 | 5.3 | 80 | copper |
| 2 | GC9 | 7.4 | 7.7 | copper | 100 | glass ceramic | 10.6 | 5.3 | 80 | copper |
| 3 | GC10 | 7.2 | 7.6 | copper | 100 | glass ceramic | 10.6 | 5.3 | 80 | copper |
| 4 | GC2 | 2.8 | 5.7 | copper | 100 | glass ceramic | 10.6 | 5.3 | 80 | copper |
| 5 | GC3 | 2.5 | 5.3 | copper | 100 | glass ceramic | 10.6 | 5.3 | 80 | copper |
| 6 | GC4 | 2.9 | 5.6 | copper | 100 | glass ceramic | 10.6 | 5.3 | 80 | copper |
| 7 | GC5 | 2.7 | 5.5 | copper | 100 | glass ceramic | 10.6 | 5.3 | 80 | copper |
| 8 | GC6 | 2.8 | 5.6 | copper | 100 | glass ceramic | 10.6 | 5.3 | 80 | copper |
| 9 | GC6 | 2.8 | 5.6 | copper | 130 | glass ceramic | 10.6 | 5.3 | 80 | copper |
| 10 | GC6 | 2.8 | 5.6 | copper | 150 | glass ceramic | 10.6 | 5.3 | 80 | copper |
| 11 | GC6 | 2.8 | 5.6 | copper | 100 | glass ceramic | 10.6 | 5.3 | 80 | copper |
| 12 | GC6 | 2.8 | 5.6 | copper | 100 | glass ceramic | 10.6 | 5.3 | 80 | copper |
| 13 | GC7 | 2.6 | 5.5 | copper | 100 | glass ceramic | 10.6 | 5.3 | 80 | copper |
| 14 | GC8 | 2.7 | 5.7 | copper | 100 | glass ceramic | 10.6 | 5.3 | 80 | copper |

TABLE 7

| Sample No. | Difference (×10⁻⁶/° C.) in the coefficient of thermal expansion | | | Sealing agent Connecting portion of laminated board | | Area ratio (S3/D1) | Temperature cycle No. (cycles) | | |
|---|---|---|---|---|---|---|---|---|---|
| | α3 − α1 | α2 − α1 | α4 − α2 | Primary mount | | | primary mount | Laminated wiring board | 2ndary mount |
| 1 | 2.7 | 5.4 | 5.4 | yes | yes | 1 | 1900 | >2000 | >2000 |
| 2 | 4.9 | 3.2 | 5.4 | yes | yes | 1 | 1200 | >2000 | >2000 |
| 3 | 4.7 | 3.4 | 5.4 | yes | yes | 1 | 1300 | >2000 | >2000 |
| 4 | 0.3 | 7.8 | 5.4 | yes | yes | 1 | >2000 | >2000 | >2000 |
| 5 | 0 | 8.1 | 5.4 | yes | yes | 1 | >2000 | >2000 | >2000 |
| 6 | 0.4 | 7.7 | 5.4 | yes | yes | 1 | >2000 | >2000 | >2000 |
| 7 | 0.2 | 7.9 | 5.4 | yes | yes | 1 | >2000 | >2000 | >2000 |
| 8 | 0.3 | 7.8 | 5.4 | yes | yes | 1 | >2000 | >2000 | >2000 |
| 9 | 0.3 | 7.8 | 5.4 | yes | yes | 1.3 | >2000 | >2000 | >2000 |
| 10 | 0.3 | 7.8 | 5.4 | yes | yes | 1.5 | >2000 | >2000 | >2000 |
| 11 | 0.3 | 7.8 | 5.4 | yes | no | 1 | >2000 | >2000 | >2000 |
| 12 | 0.3 | 7.8 | 5.4 | no | yes | 1 | >2000 | >2000 | >2000 |
| 13 | 0.1 | 8 | 5.4 | yes | yes | 1 | >2000 | >2000 | >2000 |
| 14 | 0.2 | 7.9 | 5.4 | yes | yes | 1 | >2000 | >2000 | >2000 |

As will be obvious from the results of Tables 4 to 7, in the case of the mounting structures using the first wiring boards comprising the first insulated substrates containing a cordierite crystal phase and having a predetermined composition as contemplated by the present invention, it will be learned that the reliability is improved in the primary mounting and in the second mounting, and the reliability of connection is improved between the two wiring boards.

(Experiment 3)

There was prepared a first wiring board comprising a first insulated substrate (GC 12) having a thickness of 4 mm obtained by firing a mixed powder of 28 mass % of a filler powder containing alumina and 72 mass % of a glass powder containing 45 mass % of $SiO_2$, 22 mass % of $Al_2O_3$, 18 mass % of MgO, 6 mass % of ZnO and 9 mass % of $B_2O_3$, and further having the same wiring layer as that of Experiment 1.

There were further prepared second wiring boards (having an area $S_2$ of 1600 mm²) comprising second insulated substrates (GC21 to GC27) having the same wiring layer as that of Experiment 1 and having a thickness of 1 mm by firing mixed powders of glasses (G21 to G23) of compositions shown in Table 8 and filler powders shown in Table 9.

The first wiring boards and the second wiring boards were combined together as shown in Table 10 to obtain laminated wiring boards A in quite the same manner as in Experiment 1. Onto the laminated wiring boards A were flip chip-mounted (primary mounting) the silicon semiconductor devices to obtain packages B. The packages B were secondarily mounted on the printed boards to obtain samples for evaluating the primary mounting and the secondary mounting each in a number of 20. The samples were evaluated in quite the same manner as in the Experiment 1. The results were as shown in Table 11.

TABLE 8

| | Glass composition (mass %) | | | | | |
|---|---|---|---|---|---|---|
| | $SiO_2$ | $Li_2O$ | CaO | $Al_2O_3$ | BaO | $K_2O$ |
| G21 | 73 | 8 | 13 | 4 | 0 | 2 |
| G22 | 73 | 8 | 0 | 4 | 13 | 2 |
| G23 | 68 | 8 | 2 | 20 | 0 | 2 |

TABLE 9

| | Composition of second insulated substrate | | | | | | |
|---|---|---|---|---|---|---|---|
| Sample No. | Glass powder Kind | Mass % | Filler powder Kind | Mass % | Filler powder Kind | Mass % | Precipitated* crystal phase |
| GC21 | G21 | 35 | $Mg_2SiO_4$ | 30 | quarts | 35 | Q > En > LS |
| GC22 | G21 | 50 | $Mg_2SiO_4$ | 30 | quarts | 20 | En > Q > LS |
| GC23 | G21 | 50 | $Mg_2SiO_4$ | 45 | $Al_2O_3$ | 5 | En > Fo > Co > Al |
| GC24 | G21 | 55 | $Mg_2SiO_4$ | 30 | $Al_2O_3$ | 15 | En > Sp > Al > Co |
| GC25 | G21 | 55 | $Mg_2SiO_4$ | 10 | $Al_2O_3$ | 35 | Al > Sp > Co > En |
| GC26 | G22 | 40 | $Mg_2SiO_4$ | 40 | quarts | 20 | Q > En > BS |
| GC27 | G23 | 50 | $Mg_2SiO_4$ | 25 | quarts | 25 | Co > En > Q |

*Q: quarts En: enstatite LS: lithium silicate Sp: spodumene Co: cordierite Al: alumina BS: barium silicate Fo: forsterite

TABLE 10

| | First wiring board | | | | | | Second wiring board | | | |
|---|---|---|---|---|---|---|---|---|---|---|
| Sample No. | Material | α1 (×10$^{-6}$/° C.) | Dielectric constant | Young's modulus | Wiring layer | Area (S1) | Material | α2 (×10$^{-6}$/° C.) | Dielectric constant | Young's modulus | Wiring layer |
| 1 | GC12 | 2.8 | 5.6 | 118 | copper | 100 | GC21 | 10 | 5.6 | 110 | copper |
| 2 | GC12 | 2.8 | 5.6 | 118 | copper | 100 | GC22 | 9 | 6.5 | 90 | copper |
| 3 | GC12 | 2.8 | 5.6 | 118 | copper | 100 | GC23 | 7.5 | 7 | 120 | copper |
| 4 | GC12 | 2.8 | 5.6 | 118 | copper | 100 | GC26 | 8 | 5.7 | 115 | copper |
| 5 | GC12 | 2.8 | 5.6 | 118 | copper | 130 | GC21 | 10 | 5.6 | 110 | copper |
| 6 | GC12 | 2.8 | 5.6 | 118 | copper | 150 | GC21 | 10 | 5.6 | 110 | copper |

TABLE 11

| | Difference (×10$^{-6}$/° C.) in the coefficient of thermal expansion | | | Sealing agent | | | Temperature cycle No. (cycles) | | |
|---|---|---|---|---|---|---|---|---|---|
| Sample No. | α3 − α1 | α2 − α1 | α4 − α2 | Primary mount | Connecting portion of laminated board | Area ratio (S3/D1) | primary mount | Laminated wiring board | 2ndary mount |
| 1 | 0.3 | 7.2 | 6 | yes | yes | 1 | >2000 | >2000 | 2500 |
| 2 | 0.3 | 6.2 | 7 | yes | yes | 1 | >2000 | >2000 | 2500 |
| 3 | 0.3 | 4.7 | 8.5 | yes | yes | 1 | >2000 | >2000 | 2000 |
| 4 | 0.3 | 5.2 | 8 | yes | yes | 1 | >2000 | >2000 | 2100 |
| 5 | 0.3 | 7.2 | 6 | yes | yes | 1.3 | >2000 | >2000 | 2500 |
| 6 | 0.3 | 7.2 | 6 | yes | yes | 1.5 | >2000 | >2000 | 2500 |

As will be obvious from the results of Tables 8 to 11, in the case of the mounting structures using the second wiring boards comprising the second insulated substrates containing a silicate crystal phase and having a predetermined composition as contemplated by the present invention, it will be learned that the reliability is improved in the primary mounting and in the second mounting, and the reliability of connection is improved between the two wiring boards.

What we claim is:

1. A laminated wiring board comprising:
   a first wiring board forming wiring layers on an upper surface and on a lower surface of a first ceramic insulated substrate; and
   a second wiring board forming wiring layers on an upper surface and on a lower surface of a second ceramic insulated substrate;
   the wiring layer on the lower surface of the first wiring board and the wiring layer on the upper surface of the second wiring board being connected together through connecting electrodes;
   wherein a coefficient $\forall_1$ of thermal expansion of the first ceramic insulated substrate at 0 to 150° C. and a coefficient $\forall_2$ of thermal expansion of the second ceramic insulated substrate at 0 to 150° C. are satisfying the following conditions, wherein the difference in the coefficient of thermal expansion ($\alpha_2 - \alpha_1$) is not smaller than 3.1 ppm/° C.:

$\alpha_1 < \alpha_2$ $\alpha_2 - \alpha_1 \leq 9 \times 10^{-6}$/° C.

2. A laminated wiring board according to claim 1, wherein a coefficient a1 of thermal expansion of the first insulated substrate is not larger than 7×10$^{-6}$/° C.

3. A laminated wiring board according to claim 1, wherein a ratio ($S_1/S_2$) of the area ($S_1$) of the lower surface of the first wiring board to the area ($S_2$) of the upper surface of the second wiring board is not larger than 0.3.

4. A laminated wiring board according to claim 1, wherein the first insulated substrate has a thickness $t_1$ of not smaller than 0.2 mm and the second insulated substrate has a thickness $t_2$ of not smaller than 0.5 mm.

5. A laminated wiring board according to claim 1, wherein the first insulated board has a dielectric constant of not larger than 7.

6. A laminated wiring board according to claim 1, wherein the first insulated substrate comprises a sintered body containing Si, Al, Mg, Zn, B and O as constituent elements and further containing Pb and an alkali metal in amounts suppressed, respectively, to be not larger than 0.1 mass % calculated as oxides thereof, and said sintered body contains a cordierite crystal phase as a crystal phase.

7. A laminated wiring board according to claim 6, wherein said sintered body has a composition containing 20 to 53 mass % of SiC2, 20 to 61 mass % of $Al_2O_3$, 2 to 24 mass % of MgO, 2 to 14 mass % of ZnO, and 2 to 14 mass % of $B_2O_3$ calculated as oxides.

8. A laminated wiring board according to claim 6, wherein the sintered body further contains, as a crystal phase, at least one phase selected from the group consisting of alumina, gahnite, mullite, forsterite and zirconia.

9. A laminated wiring board according to claim 1, wherein the second insulated substrate has a dielectric constant of not larger than 7.

10. A laminated wiring board according to claim 1, wherein the second insulated substrate comprises a sintered body containing, as a crystal phase, at least one kind of silicate crystals selected from the group consisting of an alkali metal silicate an alkaline earth metal silicate and a silicate including both an alkali metal and an alkaline earth metal, and has a Young's modulus of not larger than 150 GPa.

11. A laminated wiring board according to claim 10, wherein said silicate crystal is at least one selected from lithium silicate, enstatite, forsterite and barium silicate.

12. A laminated wiring board according to claim 10, wherein said sintered body constituting the second insulated substrate further contains quartz as a crystal phase.

13. A laminated wiring board according to claim 10, wherein said sintered body constituting the second insulated substrate contains Si, Mg, Ca, Al, Li and O as constituent elements and, further contains Pb in an amount that is suppressed to be not larger than 0.1 mass % calculated as an oxide thereof.

14. A laminated wiring board according to claim 13, wherein said sintered body constituting the second insulated substrate has a composition comprising 45 to 80 mass % of $SiO_2$, 2 to 35 mass % of MgO, 1 to 20 mass % of CaO, 1 to 10 mass % of $Al_2O_3$, and 1 to 10 mass % of $Li_2O$ calculated as oxides thereof.

15. A laminated wiring board according to claim 1, wherein an electric device is connected to the upper surface of the first wiring board via a plurality of connecting portions, and a difference between the coefficient $\forall_1$ of thermal expansion of the first insulated substrate and the coefficient $\forall_3$ of thermal expansion of the electric device at 0 to 150° C. is not larger than $5 \times 10^{-6}$/° C.

16. A laminated wiring board according to claim 15, wherein an area $D_1$ of a portion of the first wiring board on where the electric device is mounted is not smaller than 50 $mm^2$, and a ratio ($S_3/D_1$) of the area ($S_3$) of the upper surface of the first wiring board on where the electric device is mounted to the area $D_1$ is in a range of 1 to 1.5.

17. A mounting structure in which an external circuit board is connected, via a plurality of connecting electrodes, to the lower surface of a second wiring board in the laminated wiring board of claim 15, wherein a difference between a coefficient $\forall_4$ of thermal expansion of the external circuit board at 0 to 150° C. and a coefficient $\forall_2$ of thermal expansion of a second insulated substrate is not larger than $12 \times 10^{-6}$/° C.

* * * * *